(12) United States Patent
Sovenahalli et al.

(10) Patent No.: US 12,347,719 B2
(45) Date of Patent: Jul. 1, 2025

(54) FLOATING PIN FOR SUBSTRATE TRANSFER

(71) Applicant: Applied Materials, Inc., Santa Clara, CA (US)

(72) Inventors: Sreenath Sovenahalli, Bangalore (IN); Kirankumar Neelasandra Savandaiah, Bangalore (IN); Bhaskar Prasad, Jamshedpur (IN); Srinivasa Rao Yedla, Bangalore (IN); Thomas Brezoczky, Los Gatos, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 274 days.

(21) Appl. No.: 17/923,908

(22) PCT Filed: Apr. 12, 2021

(86) PCT No.: PCT/US2021/026793
§ 371 (c)(1),
(2) Date: Nov. 7, 2022

(87) PCT Pub. No.: WO2021/231008
PCT Pub. Date: Nov. 18, 2021

(65) Prior Publication Data
US 2023/0178416 A1    Jun. 8, 2023

Related U.S. Application Data

(63) Continuation of application No. 16/875,750, filed on May 15, 2020, now abandoned.

(51) Int. Cl.
*H01L 21/68* (2006.01)
*H01L 21/687* (2006.01)

(52) U.S. Cl.
CPC .............. *H01L 21/68742* (2013.01)

(58) Field of Classification Search
CPC ............... H01L 21/68742; C23C 16/4586
See application file for complete search history.

(56) References Cited

U.S. PATENT DOCUMENTS 6,148,762 A * 11/2000 Fukuda ............ H01L 21/68742
                                                      414/935
2009/0155025 A1    6/2009 Lerner et al.
(Continued)

FOREIGN PATENT DOCUMENTS

CN    101802257 A    8/2010
CN    106653674 A    5/2017
(Continued)

OTHER PUBLICATIONS

International Search Report dated Jul. 30, 2021 for Application No. PCT/US2021/026793.
(Continued)

*Primary Examiner* — Lee D Wilson
(74) *Attorney, Agent, or Firm* — Patterson + Sheridan, LLP (57) ABSTRACT

A floating pin for positioning a substrate relative to a substrate support includes a shaft configured to move through a guide hole in a substrate support, and a pin head including a top surface and a flat shoulder surface disposed between the top surface and the shaft. The flat shoulder surface is configured to be seated on a recessed surface of the substrate support and seal the guide hole of the substrate support.

17 Claims, 6 Drawing Sheets

(56) References Cited

U.S. PATENT DOCUMENTS

| | | | |
|---|---|---|---|
| 2013/0139753 A1 | 6/2013 | Kang et al. | |
| 2014/0216332 A1* | 8/2014 | Omori | H01L 21/68742 118/50 |
| 2017/0067157 A1 | 3/2017 | Ashihara et al. | |
| 2017/0125280 A1* | 5/2017 | Ghosh | H01L 21/68757 |
| 2021/0159112 A1* | 5/2021 | Kim | H01L 21/67103 |
| 2022/0293452 A1* | 9/2022 | Sulyman | H01L 21/68742 |

FOREIGN PATENT DOCUMENTS

| | | | | |
|---|---|---|---|---|
| JP | 2005347751 | | 12/2005 | |
| JP | 2008160056 A | | 7/2008 | |
| JP | 2009068037 A | * | 4/2009 | C23C 16/4401 |
| JP | 201021405 A | | 1/2010 | |
| JP | 5876065 B2 | | 3/2016 | |
| KR | 2014-0089106 A | | 7/2014 | |
| KR | 20150125033 A | | 11/2015 | |
| KR | 2016-0032501 A | | 3/2016 | |
| TW | 201341581 A | | 10/2013 | |
| TW | 201718925 A | | 6/2017 | |
| TW | 201743414 A | | 12/2017 | |
| WO | 2013054776 A1 | | 4/2013 | |
| WO | WO-2022192187 A1 | * | 9/2022 | H01J 37/32715 |

OTHER PUBLICATIONS

Taiwan Office Action dated Jan. 3, 2024 for Application No. 110114080.
Japanese Office Action dated Jun. 25, 2024 for Application No. 2022-569223.
Korean Office Action dated May 20, 2024 for Application No. 10-2022-7043488.
Taiwan Office Action dated Aug. 2, 2024 for Application No. 110114080.
Korean Office Action dated Jan. 28, 2025 for Application No. 10-2022-7043488.
Japanese Office Action dated Feb. 10, 2025 for Application No. 2022-569223.
Taiwan Office Action dated Dec. 26, 2024 for Application No. 110114080.
Taiwan Office Action dated Feb. 26, 2025 for Application No. 110114080.

* cited by examiner

FIG. 6

# FLOATING PIN FOR SUBSTRATE TRANSFER

FIELD

Embodiments of the present disclosure generally relate to methods and apparatuses for processing semiconductor substrates. More particularly, embodiments of the disclosure relate lift pin assemblies for positioning a substrate relative to a substrate support.

BACKGROUND

Conventional semiconductor substrate processing tools (e.g., a cluster tool) are configured to perform one or more processes during substrate processing. For example, a cluster tool can include a physical vapor deposition (PVD) configured to perform a PVD process on a substrate, an atomic layer deposition (ALD) chamber configured to perform an ALD process on a substrate, a chemical vapor deposition (CVD) chamber configured to perform a CVD process on a substrate, etc., and/or one or more other processing chambers, e.g., a preclean process chamber. The cluster tool can include a robot to move the substrate(s) to/from the various processing chambers, buffer chambers and/or load locks coupled to the mainframe of the cluster tool.

While such semiconductor substrate processing tools (i.e., cluster tools) are suitable for processing a substrate or multiple substrates, a process gas leaks from a substrate support that has guide holes to accommodate lift pins. Lift pins are used for transferring a substrate from a robot arm onto the substrate support. Such process gas leakage may impact a thermal contact resistance between a substrate and a substrate support on which the substrate is deposited, leading to improper and non-uniform chucking of the substrate to the substrate support during substrate processing. Existing lift pins are enabled only to transfer a substrate to a substrate support without providing any type of sealing to avoid process gas leakage.

Therefore, there is a need in the art for lift pins that transfer a substrate to a substrate support and provide sealing to reduce process gas leakage through the substrate support.

SUMMARY

Embodiments described herein provide a floating pin for positioning a substrate relative to a substrate support. A floating pin includes a shaft configured to move through a guide hole in a substrate support, and a pin head including a top surface and a flat shoulder surface disposed between the top surface and the shaft. The flat shoulder surface is configured to be seated on a recessed surface of the substrate support and seal the guide hole of the substrate support.

Embodiments described herein also provide a lift pin assembly for positioning a substrate relative to a substrate support. A lift pin assembly includes a floating pin having a pin head and a shaft, and a lift pin configured to contact an end of the shaft opposite the pin head and move the shaft through a guide hole in the substrate support. The pin head includes a top surface and a flat shoulder surface disposed between the top surface and the shaft, and the flat shoulder surface is configured to be seated on a recessed surface of the substrate support and seal the guide hole of the substrate support.

Embodiments described herein also provide a processing system. A processing system includes a substrate support having a guide hole therethrough and a lift pin assembly. The guide hole includes a seating portion and a guide portion. The seating portion includes a flat shoulder surface between a front-side surface of the substrate support and the guide portion. A lift pin assembly includes a floating pin having a pin head configured to be seated in the seating portion and a shaft configured to move through the guide portion. A lift pin is configured to contact an end of the shaft opposite the pin head and move the floating pin through the guide hole in the substrate support. The pin head includes a top surface and a flat shoulder surface disposed between the top surface and the shaft, and the flat shoulder surface of the pin head is configured to be seated on the flat shoulder surface of the seating portion and seal the guide hole of the substrate support.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of apparatus and systems for substrate processing are provided herein. Particularly, some embodiments are directed to a lift pin assembly that includes a floating pin and a lift pin that moves the floating pin through a guide hole of a substrate support. The floating pin described below includes a pin head having a flat shoulder that is seated on a recessed surface of the substrate support and seals the guide hole of the substrate support. This sealing prevents gas leakage through the guide hole and thus maintains the process pressure within a processing chamber. In some embodiments, the pin head also has a countersunk portion above the flat shoulder surface and provides further sealing of the guide hole.

Figure 1:
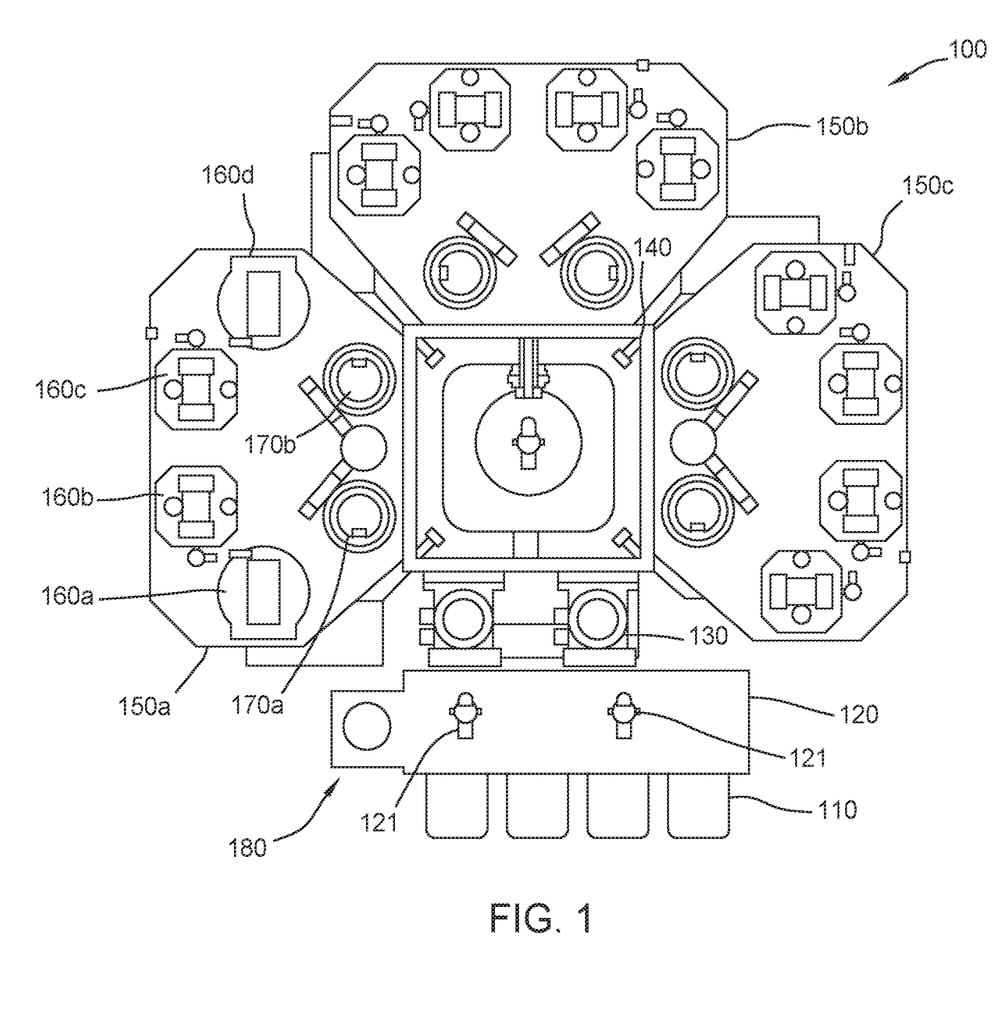
FIG. 1 is a top plan view of a system according to one embodiment.

FIG. 1 is a top plan view of a system 100 in accordance with at least some embodiments of the disclosure. The system 100 includes a front-end module 110, an interface module 120, and a pair of load locks 130 (hereinafter referred to as the load locks 130). The system also includes a buffer (or vacuum transfer) chamber 140 and a plurality (e.g., three) of multi environment chambers 150a-150c including a plurality of processing chambers 160a-160d (hereinafter the processing chambers 160), and/or enclosed areas 170a and 170b (hereinafter the enclosed areas 170).

Figure 2:
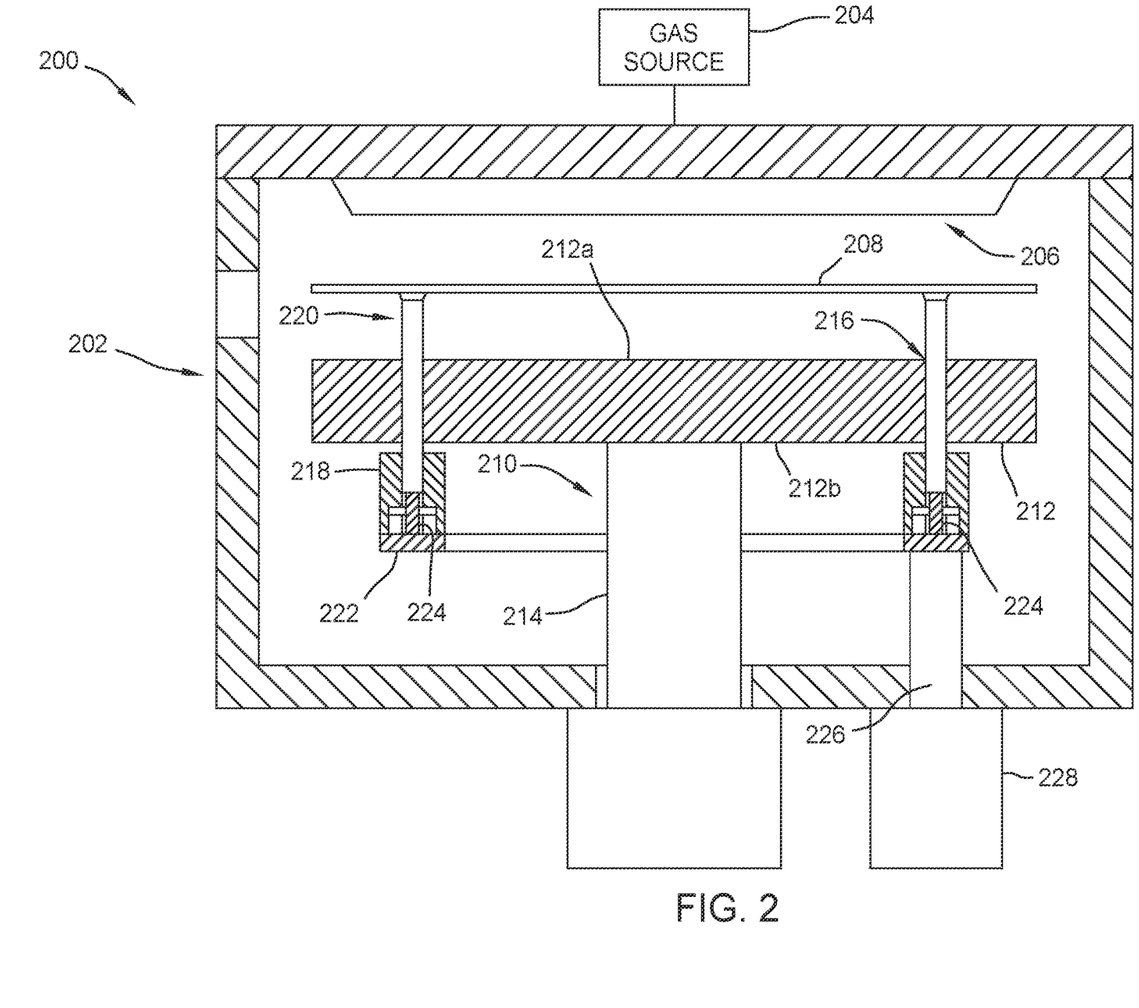
FIG. 2 is a cross-sectional view of a processing system according to one embodiment.

FIG. 2 depicts a cross-sectional view of a processing system 200 that includes any processing chamber described above with respect to FIG. 1. The processing system 200 generally comprises a chamber body 202 coupled to a gas source 204. The chamber body 202 is typically a unitary machined structure fabricated from a rigid block of material such as aluminum. Within the chamber body 202 is a showerhead 206 and a substrate support assembly 210. The showerhead 206 is coupled to the upper surface or lid of the chamber body 202 and provides a uniform flow of gas from the gas source 204 that is dispersed over a substrate 208 positioned on a substrate support assembly 210.

The substrate support assembly 210 generally includes a substrate support 212 and a stem 214. The stem 214 positions the substrate support 212 within the chamber body 202. A substrate 208 is placed upon the substrate support 212 during processing. The substrate support 212 may be a susceptor, a heater, an electrostatic chuck or a vacuum chuck. Typically, the substrate support 212 is fabricated from a material selected from ceramic, aluminum, stainless steel, and combinations thereof. The substrate support 212 has a plurality of guide holes 216 disposed therethrough. Each guide hole 216, or alternatively an inner passage of a guide bushing disposed within the guide hole 216 (such as a through-hole 306 in a bush mechanism 304 shown in FIG. 3) accommodates a floating pin 218 of a lift pin assembly 220.

The lift pin assembly 220 interacts with the substrate support 212 to position the substrate 208 relative to the substrate support 212. The lift pin assembly 220 includes the floating pins 218, a lift plate 222 with a lift pin 224 disposed thereon, a stem 226 connected to the lift plate 222, and a lifting mechanism 228, such as an actuator, for controlling the elevation of the lift plate 222. The elevation of the stem 226 is controlled by the lifting mechanism 228. The lifting mechanism 228 may be a pneumatic cylinder, hydraulic cylinder, lead screw, solenoid, stepper motor, or other motion device that is typically positioned outside of the chamber body 202 and adapted to move the stem 226. As the stem 226 and the lift plate 222 connected to the stem 226 are moved upward towards the substrate support 212, the lift pin 224 mounted on the lift plate 222 contacts the lower end of the floating pin 218 to move the floating pin 218 through the guide hole 216 of the substrate support 212. The upper end of the floating pin 218 exits the guide hole 216 of the substrate support 212 and lift the substrate 208 into a spaced-apart relation relative to the front-side surface 212a of the substrate support 212.

The floating pin 218 is typically formed of ceramic, stainless steel, aluminum, aluminum nitride, aluminum oxide, sapphire, or other suitable material. In some embodiments, the floating pin 218 is formed of aluminum nitride (AlN). Floating pins formed of AlN improves lift pin thermal dissipation capacity due to its higher thermal conductivity. If desired, the floating pins 218 may be AlN containing yttrium oxide ($Y_2O_3$) of about 2 wt % to about 5 wt % to further enhance the thermal conductivity. A cylindrical outer surface of the floating pin 218 may additionally be treated to reduce friction and surface wear. For example, the cylindrical outer surface of the floating pin 218 may be plated, plasma flame sprayed, or electropolished to reduce friction, alter the surface hardness, improve smoothness, or improve resistance to scratching and corrosion. The lift pins 224 may be formed of stainless steel (SST).

Figure 3:
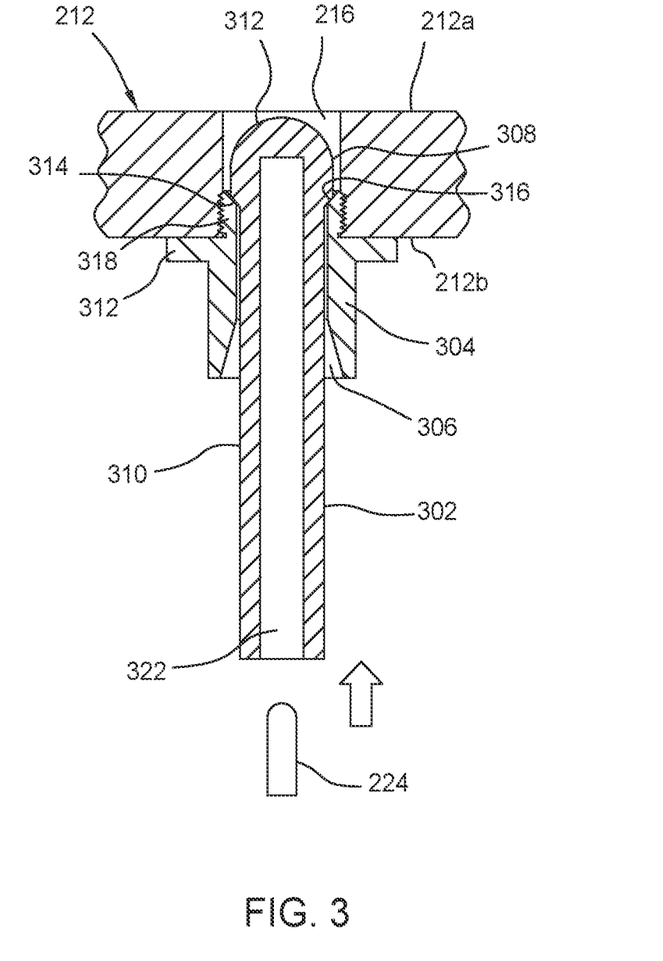
FIG. 3 is a schematic view of a floating pin according to one embodiment.

FIG. 3 illustrates a telescopic floating pin 302 that may be used as the floating pins 218 in FIG. 2. A bush mechanism 304 is fitted at least partially in the guide hole 216 of the substrate support 212 and bonded to a back-side surface 212b of the substrate support 212. The bush mechanism 304 has a through-hole 306. The bush mechanism 304 may be made of ceramic. The telescopic pin 302 has a pin head 308 and a shaft 310. The pin head 308 has a rounded tip 312, which contacts a substrate 208 when the telescopic floating pin 302 is pushed up to lift the substrate 208. The pin head 308 has a larger lateral diameter than the shaft 310. The shaft 310 extends through the through-hole 306 of the bush mechanism 304. The telescopic floating pin 302 has a beveled surface 314 from the pin head 308 to the shaft 310.

The bush mechanism 304 has an insert portion 318 and a flange portion 320. The insert portion 318 is inserted into the guide hole 216 of the substrate support 212 from the back-side surface 212b of the substrate support 212, and the flange portion 320 contacts (and forms a seal with) the back-side surface 212b of the substrate support 212. The bush mechanism 304 may be secured to the substrate support 212 by, for example, screws through the flange portion 320 screwed into the substrate support 212. The exterior sidewall surface of the insert portion 318 can contact a sidewall surface of the guide hole 216, although some gap therebetween may occur.

The insert portion 318 also has a beveled surface 316 extending from the exterior sidewall surface of the insert portion 318 to an interior sidewall surface of the through-hole 306 of the bush mechanism 304. The beveled surface 316 of the insert portion 318 generally corresponds with the beveled surface 314 of the telescopic floating pin 302. In a retracted position when a substrate 208 rests on the front-side surface 212a of the substrate support 212, the two beveled surfaces 314, 316 mate. The contacting of the flange portion 320 to the back-side surface 212b of the substrate support 212 and mating of the two beveled surfaces 314, 316 create a seal through the guide hole 216, which reduces gas leakage and particle contamination through the substrate support 212 and thus maintains the pressure within the processing chamber during processing.

In the retracted position, the corresponding lift pin 224 is not providing a lifting force to the telescopic floating pin 302 and may be separated from the telescopic floating pin 302. In this position, no force other than a gravitational force is acting on the telescopic floating pin 302. The gravitational force causes the telescopic floating pin 302 to be retracted such that the beveled surface 314 of the telescopic floating pin 302 is seated on and mates with the beveled surface 316 of the insert portion 318 of the bush mechanism 304. This creates a seal as described above. In this position, the rounded tip 312 is entirely below a surface of the substrate support 212 on which a substrate 208 can rest.

To lift a substrate 208 from the front-side surface 212a of the substrate support 212, the lifting mechanism 228 elevates the lift plate 222 on which the lift pin 224 is disposed, which causes the lift pin 224 to enter an internal cut-out 322 and move upward in direction 324. Further upward movement of the lift pin 224 provides an upward force to the telescopic floating pin 302 such that the pin head 308 of the telescopic floating pin 302 exits the guide hole 216 of the substrate support 212. Extension of the telescopic floating pin 302 above the front-side surface 212a of the substrate support 212 causes the rounded tip 312 to contact a backside surface of the substrate 208 and lift the substrate 208 from the front-side surface 212a of the substrate support 212.

Thereafter, the lifting mechanism 228 moves the lift plate 222 downward, which causes the lift pins 224 to move downward. Downward movement of the lift pin 224 removes the previously applied upward force to the telescopic floating pin 302 such that the gravitational force acting on the telescopic floating pin 302 causes the telescopic floating pin 302 to return to the retracted position, where the beveled surface of the telescopic floating pin 302 is seated on and mates with the beveled surface of the insert portion 318 of the bush mechanism 304.

A number of other examples of floating pins 218 are described below. Some examples use surfaces of the guide hole 216 recessed from the front-side surface 212a of the substrate support 212 to form a seal with the floating pin 218. A bush mechanism 304 may be omitted. Various configurations of mating surfaces that form a seal and various configurations of a head of the floating pin 218 are described below. Any aspect of these configurations can be combined with any other aspect of another configuration. A person having ordinary skill in the art will readily envision modifications and combinations that can be achieved and are contemplated within the scope of other examples.

Figure 4:
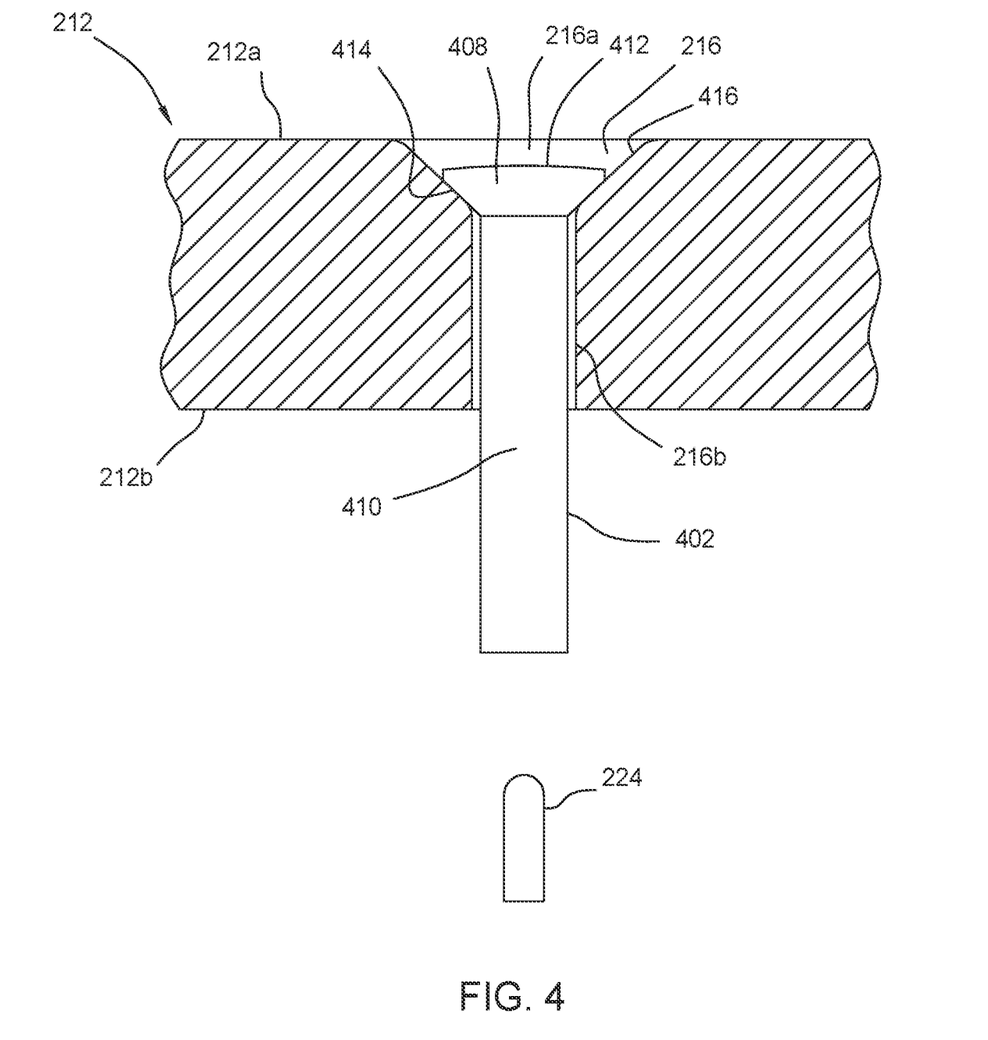
FIG. 4 is a schematic view of a floating pin according to one embodiment.

FIG. 4 illustrates an example floating pin 402 that may be used as the floating pins 218 in FIG. 2. The floating pin 402 has a countersunk pin head 408 and a shaft 410. The countersunk pin head 408 has a top surface 412 that includes a flat surface, a rounded surface, a conical surface, the like, or a combination of these surfaces. The countersunk pin head 408 contacts a substrate 208 when the floating pin 402 is pushed up to lift the substrate 208. The top surface 412 of the countersunk pin head 408 has a larger lateral diameter than the shaft 410 of the floating pin 402. The countersunk pin head 408 has a beveled surface 414 extending from the top surface 412 of the countersunk pin head 408 to the shaft 410 of the floating pin 402.

The guide hole 216 of the substrate support 212 includes a seating portion (also referred to as an opening of the substrate support 212) 216a that accommodates the countersunk pin head 408, and a guide portion 216b that accommodates the shaft 410. The seating portion 216a has a beveled surface 416 extending from the front-side surface 212a of the substrate support 212 to an interior sidewall surface of the guide portion 216b of the guide hole 216. For example, the beveled surface 416 may be a result of countersinking the guide hole 216. The beveled surface 416 of the seating portion 216a generally corresponds with the beveled surface 414 of the countersunk pin head 408. In a retracted position, the two beveled surfaces 414, 416 mate. The mating of the two beveled surfaces 414, 416 creates a seal through the guide hole 216, which reduces gas leakage and particle contamination through the substrate support 212 during processing. The floating pin 402 can be caused to be in a retracted position and can be caused to extend from the surface of the substrate support 212 like described above with respect to the telescopic floating pin 302 of FIG. 3.

Figure 5:
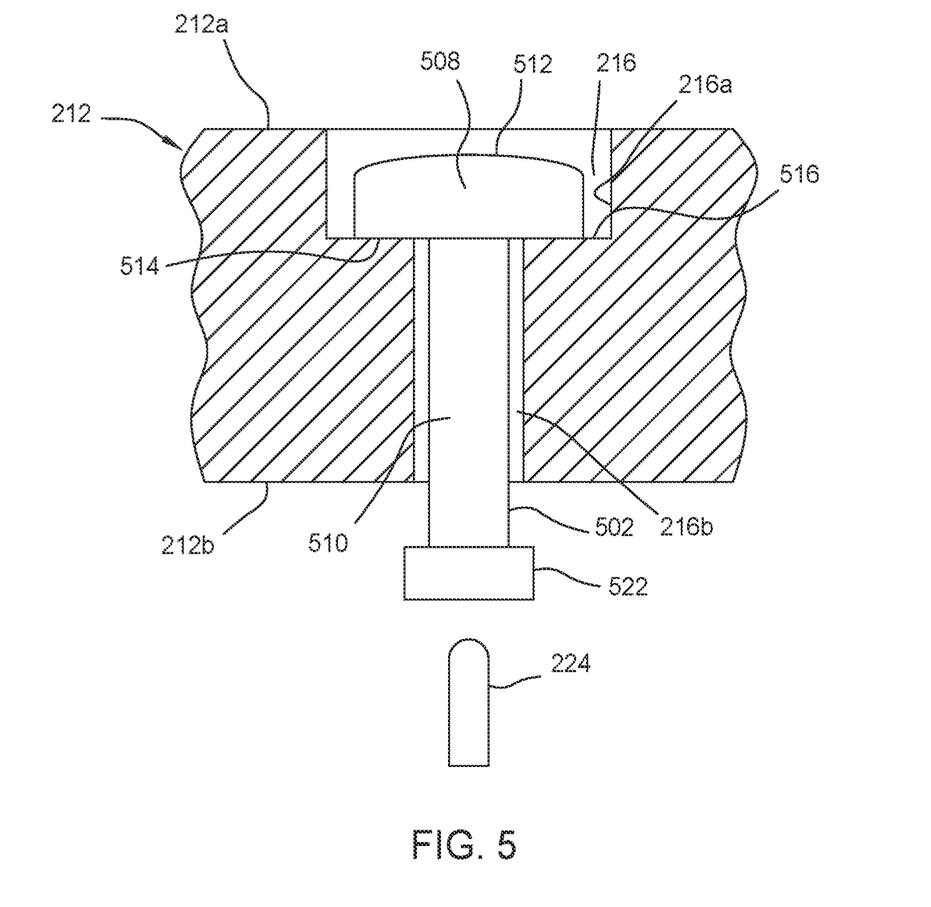
FIG. 5 is a schematic view of a floating pin according to one embodiment.

FIG. 5 illustrates an example floating pin 502 that may be used as the floating pins 218 in FIG. 2. The floating pin 502 has a shoulder pin head 508 and a shaft 510. The shoulder pin head 508 has a top surface 512 that includes a flat surface, a rounded surface, a conical surface, the like, or a combination of these surfaces. The shoulder pin head 508 contacts a substrate 208 when the floating pin 502 is pushed up to lift the substrate 208. The shoulder pin head 508 has a larger lateral diameter than the shaft 510 of the floating pin 502. The shaft 510 extends through the guide hole 216 of the substrate support 212. The shoulder pin head 508 has a flat shoulder surface 514 from the exterior edges of the shoulder pin head 508 to the shaft 510 of the floating pin 502.

The guide hole 216 of the substrate support 212 includes a seating portion 216a that accommodates the shoulder pin head 508, and a guide portion 216b that accommodates the shaft 510. The seating portion 216a has a flat shoulder surface 516 recessed below the front-side surface 212a of the substrate support 212. This flat shoulder surface 516 is also referred to as a recessed surface of the substrate support 212. The flat shoulder surface 516 of the seating portion 216a generally corresponds with the flat shoulder surface 514 of the shoulder pin head 508. In a retracted position, the two flat shoulder surfaces 514, 516 mate. The mating of the two flat shoulder surfaces 514, 516 creates a seal through the guide hole 216, which reduces gas leakage and particle contamination through the substrate support 212 during processing.

The seating portion 216a of the guide hole 216 has a diameter larger than a diameter of the shoulder pin head 508 such that the shoulder pin head 508 does not touch the interior sidewall surface of the seating portion 216a even when the floating pin 502 moves upward and downward slightly tilted with respect to the guide hole 216. The guide portion 216b of the guide hole 216 has a diameter larger than a diameter of the shaft 510 to allow movement of the shaft 510 through the guide portion 216b. A clearance between the shaft 510 and the interior sidewall surface of the guide portion 216b is sealed by the flat shoulder surface 514 of the shoulder pin head 508, since the flat shoulder surface 514 has a large enough diameter to cover the clearance. In a case where the centerline of the floating pin 502 is misaligned (i.e., tilted) with respect to the centerline of the guide hole 216, the gravitational force causes the floating pin 502 to be retracted such that the shoulder pin head 508 is positioned within the seating portion 216a and the flat shoulder surface 514 of the shoulder pin head 508 is seated against the flat shoulder surface 516 of the seating portion 216a of the guide hole 216. In some embodiments, to enhance the retraction of the floating pin 502 that is misaligned and sealing of the clearance between the shaft 510 and the interior sidewall surface of the guide hole 216, a dead weight 522 is added at the lower end (i.e., on the opposite side of the shoulder pin head 508) of the shaft 510. The dead weight 622 may be made of Stainless Steel 316 (SS 316) and weigh between about 13 g and about 20 g.

In some embodiments, the flat shoulder surface 516 of the seating portion 216a of the guide hole 216 has a diameter of between about 10.6 mm and about 10.8 mm, such as about 10.8 mm, and the guide portion 216b of the guide hole 216 has a diameter of between about 3.95 mm and about 4.05 mm, such as about 4 mm. The flat shoulder surface 514 of the shoulder pin head 518 has a diameter of between about 8.9 mm and about 9.1 mm, such as about 9 mm, and the shaft 510 of the floating pin 502 has a diameter of between about 3.225 mm and about 3.285 mm, such as about 3.25 mm, allowing a clearance to the interior sidewall surface of the guide portion 216b of the guide hole 216 of between about 0.3 mm and about 0.4 mm, such as about 0.34 mm.

The floating pin 502 can be caused to be in a retracted position and can be caused to extend from the surface of the substrate support 212 like described above with respect to the telescopic floating pin 302 of FIG. 3.

Figure 6:
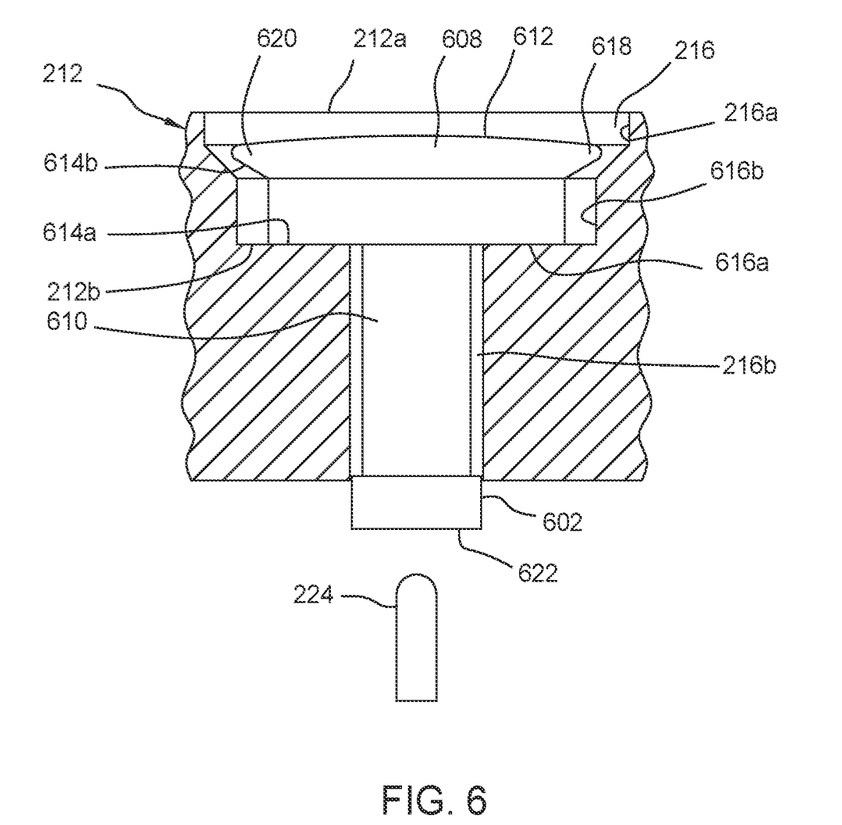
FIG. 6 is a schematic view of a floating pin according to one embodiment.

FIG. 6 illustrates an example floating pin 602 that may be used as the floating pins 218 in FIG. 2. The floating pin 602 has a shouldered countersunk pin head 608 and a shaft 610.

The shouldered countersunk pin head 608 has a top surface 612 that includes a flat surface, a rounded surface, a conical surface, the like, or a combination of these surfaces. The shouldered countersunk pin head 608 contacts a substrate 208 when the floating pin 602 is pushed up to lift the substrate 208. The shouldered countersunk pin head 608 includes a shoulder portion 618 and a countersunk portion 620. The top surface 612 of the shouldered countersunk pin head 608 has a larger lateral diameter than the shoulder portion 618, and the shoulder portion 618 has a larger lateral diameter of the shaft 610 of the floating pin 602. The shoulder portion 618 of the shouldered countersunk pin head 608 has a flat shoulder surface 614a extending from the shaft 610 of the floating pin 602 to the exterior sidewall surface of the shoulder portion 618 of the shouldered countersunk pin head 608. The countersunk portion 620 of the shouldered countersunk pin head 608 has a beveled surface 614b extending from the exterior surface of the shoulder portion 618 to the top surface 612 of the shouldered countersunk pin head 608.

The guide hole 216 of the substrate support 212 includes a seating portion 216a that accommodates the shouldered countersunk pin head 608, and a guide portion 216b that accommodates the shaft 610. The seating portion 216a includes a flat shoulder surface 616a recessed below the front-side surface 212a of the substrate support 212. This flat shoulder surface 616a is also referred to as a recessed surface of the substrate support 212. The seating portion 216a further includes a beveled surface 616b between the flat shoulder surface 616a and the front-side surface 212a of the substrate support 212. This beveled surface 616b is also referred to as a beveled surface of the substrate support 212. The beveled surface 616b of the seating portion 216a generally corresponds with the beveled surface 614b of the countersunk portion 620 of the shouldered countersunk pin head 608. The flat shoulder surface 616a of the seating portion 216a generally corresponds with the flat shoulder surface 614a of the shoulder portion 618 of the shouldered countersunk pin head 608. In a retracted position, the two beveled surfaces 614b, 616b and/or the two flat shoulder surfaces 614a, 616a mate. The mating of the two beveled surfaces 614b, 616b and/or the two flat shoulder surfaces 614a, 616a creates a seal through the guide hole 216, which reduces gas leakage and particle contamination through the substrate support 212 during processing.

The seating portion 216a of the guide hole 216 has a diameter larger than a diameter of the shouldered countersunk pin head 608 such that the shouldered countersunk pin head 608 does not touch the interior sidewall surface of the seating portion 216a even when the floating pin 602 moves upward and downward slightly tilted with respect to the guide hole 216. The guide portion 216b of the guide hole 216 has a diameter larger than a diameter of the shaft 610 to allow movement of the shaft 610 through the guide portion 216b. A clearance between the shaft 610 and the interior sidewall surface of the guide portion 216b is sealed by the flat shoulder surface 614a of the shoulder portion 618 of the shouldered countersunk pin head 608, since the flat shoulder surface 614a has a large enough diameter to cover the clearance. The beveled surface 614b of the countersunk portion 620 of the shouldered countersunk pin head 608 provides further sealing of the clearance between the shaft 610 and the interior sidewall surface of the guide portion 216b.

In a case where the centerline of the floating pin 602 is misaligned (i.e., tilted) with respect to the centerline of the guide hole 216, the gravitational force causes the floating pin 602 to be retracted such that the shouldered countersunk pin head 608 is positioned within the seating portion 216a and the flat shoulder surface 614a of the shoulder portion 618 of the shouldered countersunk pin head 608 is seated against the flat shoulder surface 616a of the seating portion 216a of the guide hole 216. In some embodiments, to enhance the retraction of the floating pin 602 that is misaligned and sealing of the clearance between the shaft 610 and the interior sidewall surface of the guide hole 216, a dead weight 622 is added at the lower end (i.e., on the opposite side of the shouldered countersunk pin head 608) of the shaft 610. The dead weight 622 may be made of Stainless Steel 316 (SS 316) and weigh between about 13 g and about 20 g.

In some embodiments, the seating portion 216a of the guide hole 216 at the front-side surface 212a of the substrate support 212 has a diameter of between about 12.6 mm and about 12.8 mm, such as about 12.7 mm. The flat shoulder surface 616 of the seating portion 216a of the guide hole 216 has a diameter of between about 10.6 mm and about 10.8 mm, such as about 10.8 mm, and the guide portion 216b of the guide hole 216 has a diameter of between about 3.95 mm and about 4.05 mm, such as about 4 mm. The top surface 612 of the shouldered countersunk pin head 608 has a diameter of between about 11.1 mm and about 11.2 mm, such as about 11.2 mm. The flat shoulder surface 614a of the shoulder portion 618 of the shouldered countersunk pin head 608 has a diameter of between about 8.9 mm and about 9.1 mm, such as about 9 mm, and the shaft 610 of the floating pin 602 has a diameter of between about 3.225 mm and about 3.285 mm, such as about 3.25 mm, allowing a clearance to the interior sidewall surface of the guide portion 216b of the guide hole 216 of between about 0.3 mm and about 0.4 mm, such as about 0.34 mm.

The floating pin 602 can be caused to be in a retracted position and can be caused to extend from the surface of the substrate support 212 like described above with respect to the telescopic floating pin 302 of FIG. 3.

Benefits of the present disclosure include an improved floating pin for positioning a substrate relative to a substrate support in a substrate processing system. The floating pin has a flat shoulder surface that is seated on a recessed surface of the substrate support and seal a guide hole formed to guide the floating pin in the substrate support. This sealing prevents gas leak from the guide hole and thus maintains the pressure within the substrate processing system.

While the foregoing is directed to embodiments of the present disclosure, other and further embodiments of the disclosure may be devised without departing from the basic scope thereof, and the scope thereof is determined by the claims that follow.

What is claimed is:

1. A floating pin for positioning a substrate relative to a substrate support, the floating pin comprising:
   a shaft configured to move through a guide hole in the substrate support; and
   a pin head comprising a top surface and a flat shoulder surface disposed between the top surface and the shaft, wherein
   the flat shoulder surface is configured to be seated on a recessed surface of the substrate support and seal the guide hole of the substrate support, and
   the pin head comprises:
      a shoulder portion that includes the flat shoulder surface; and
      a countersunk portion that includes the top surface having a larger diameter than the flat shoulder surface, the countersunk portion having a beveled surface extending from an exterior sidewall surface of the shoulder portion to the top surface.

2. The floating pin of claim 1, wherein:
the flat shoulder surface has a diameter of between 8.9 mm and 9.1 mm, and
the shaft has a diameter of between 3.225 mm and 3.285 mm, having a clearance to an interior sidewall surface of the guide hole of between 0.3 mm and 0.4 mm.

3. The floating pin of claim 1, wherein:
the flat shoulder surface has a diameter of between 8.9 mm and 9.1 mm,
the top surface has a diameter of between 11.1 mm and 11.2 mm, and
the shaft has a diameter of between 3.225 mm and 3.285 mm, having a clearance to an interior sidewall surface of the guide hole of between 0.3 mm and 0.4 mm.

4. The floating pin of claim 1, wherein the shaft comprises aluminum oxide.

5. The floating pin of claim 1, further comprising:
a dead weight disposed at an end of the shaft opposite the pin head.

6. The floating pin of claim 5, wherein the dead weight comprises stainless steel and weighs between 13 g and 20 g.

7. A lift pin assembly for positioning a substrate relative to a substrate support, the lift pin assembly comprising:
a floating pin having a pin head and a shaft; and
a lift pin configured to contact an end of the shaft opposite the pin head and move the shaft through a guide hole in the substrate support, wherein:
the pin head comprises a top surface and a flat shoulder surface disposed between the top surface and the shaft,
the flat shoulder surface is configured to be seated on a recessed surface of the substrate support and seal the guide hole of the substrate support, and
the pin head comprises:
a shoulder portion that includes the flat shoulder surface; and
a countersunk portion that includes the top surface having a larger diameter than the flat shoulder surface, the countersunk portion having a beveled surface extending from an exterior sidewall surface of the shoulder portion to the top surface.

8. The lift pin assembly of claim 7, wherein:
the flat shoulder surface has a diameter of between 8.9 mm and 9.1 mm, and
the shaft has a diameter of between 3.225 mm and 3.285 mm, having a clearance to an interior sidewall surface of the guide hole of between 0.3 mm and 0.4 mm.

9. The lift pin assembly of claim 7, wherein:
the flat shoulder surface has a diameter of between 8.9 mm and 9.1 mm,
the top surface has a diameter of between 11.1 mm and 11.2 mm, and
the shaft has a diameter of between 3.225 mm and 3.285 mm, having a clearance to an interior sidewall surface of the guide hole of between 0.3 mm and 0.4 mm.

10. The lift pin assembly of claim 7, wherein:
the shaft comprises aluminum oxide, and
the lift pin comprises stainless steel.

11. The lift pin assembly of claim 7, further comprising:
a dead weight disposed at an end of the shaft opposite the pin head.

12. The lift pin assembly of claim 11, wherein the dead weight comprises stainless steel and weighs between 13 g and 20 g.

13. A processing system, comprising:
a substrate support having a guide hole therethrough, the guide hole comprising a seating portion and a guide portion, wherein the seating portion comprises a flat shoulder surface between a front-side surface of the substrate support and the guide portion; and
a lift pin assembly comprising:
a floating pin having a pin head configured to be seated in the seating portion and a shaft configured to move through the guide portion; and
a lift pin configured to contact an end of the shaft opposite the pin head and move the floating pin through the guide hole in the substrate support, wherein:
the pin head comprises a top surface and a flat shoulder surface disposed between the top surface and the shaft, and
the flat shoulder surface of the pin head is configured to be seated on the flat shoulder surface of the seating portion and seal the guide hole of the substrate support, and
the pin head comprises:
a shoulder portion that includes the flat shoulder surface; and
a countersunk portion that includes the top surface having a larger diameter than the flat shoulder surface, the countersunk portion having a beveled surface extending from an exterior sidewall surface of the shoulder portion to the top surface.

14. The processing system of claim 13, wherein:
the flat shoulder surface of the pin head has a diameter of between 8.9 mm and 9.1 mm,
the shaft has a diameter of between 3.225 mm and 3.285 mm,
the flat shoulder surface of the seating portion has a diameter of between 10.6 mm and 10.8 mm, and
the guide portion has a diameter of between about 3.95 mm and about 4.05 mm.

15. The processing system of claim 13, wherein:
the flat shoulder surface has a diameter of between 8.9 mm and 9.1 mm,
the top surface has a diameter of between 11.1 mm and 11.2 mm,
the shaft has a diameter of between 3.225 mm and 3.285 mm, having a clearance to an interior sidewall surface of the guide hole of between 0.3 mm and 0.4 mm,
the flat shoulder surface of the seating portion has a diameter of between 12.6 mm and 12.8 mm, and
the guide portion has a diameter of between about 3.95 mm and about 4.05 mm.

16. The processing system of claim 13, wherein:
the shaft comprises aluminum oxide, and
the lift pin comprises stainless steel.

17. The processing system of claim 13, further comprising:
a dead weight disposed at an end of the shaft opposite the pin head, wherein the
dead weight comprises stainless steel and weighs between 13 g and 20 g.

* * * * *